United States Patent [19]

Reitz

[11] 4,235,662
[45] Nov. 25, 1980

[54] LAYER OF CRYSTALLINE SILICON HAVING (111) ORIENTATION ON (111) SURFACE OF LITHIUM ALUMINUM

[75] Inventor: Norman E. Reitz, Redwood City, Calif.

[73] Assignee: Sotec Corporation, Palo Alto, Calif.

[21] Appl. No.: 920,093

[22] Filed: Jun. 28, 1978

Related U.S. Application Data

[63] Continuation-in-part of Ser. No. 872,625, Jan. 26, 1978.

[51] Int. Cl.³ ............... C30B 23/06; C30B 25/10; C30B 25/18
[52] U.S. Cl. ............................... 156/612; 156/613; 156/614; 156/DIG. 64
[58] Field of Search ............... 156/609, 610, 613, 614, 156/621, 624, DIG. 64, 612; 423/348, 350; 136/89 SG; 427/58, 167

[56] References Cited

U.S. PATENT DOCUMENTS

| | | | |
|---|---|---|---|
| 3,325,392 | 6/1967 | Rummel | 156/610 |
| 3,563,730 | 2/1971 | Bach et al. | 75/134 A |
| 3,957,532 | 5/1976 | Settle et al. | 75/134 A |
| 3,990,914 | 11/1976 | Weinstein et al. | 156/610 |
| 4,011,372 | 3/1977 | Tomezuk et al. | 75/134 A |
| 4,042,447 | 8/1977 | Reitz | 156/610 |
| 4,115,625 | 9/1978 | Reitz | 428/641 |

OTHER PUBLICATIONS

Erhrath; "Growth . . . Aluminum Layers"; J. of Elec. Matl.; vol. 4; pp. 1207–1227; (1975).

*Primary Examiner*—Bradley R. Garris
*Attorney, Agent, or Firm*—Phillips, Moore, Weissenberger, Lempio & Majestic

[57] ABSTRACT

Low strain heteroepitaxy of (111) silicon on (111) lithium aluminum between the reconstructed 7×7 surface of (111) silicon and a 6×6 array of aluminum atoms on the surface of the (111) lithium aluminum. The 7×7 reconstructed (111) silicon surface contains 36 silicon atoms and 13 vacancies for every 49 surface sites. The 36 silicon atoms on an area averaged basis match the 36 aluminum atoms in the 6×6 aluminum diamond structure (zero vacancies) present at the (111) surface of lithium aluminum to within about 1%.

9 Claims, 6 Drawing Figures

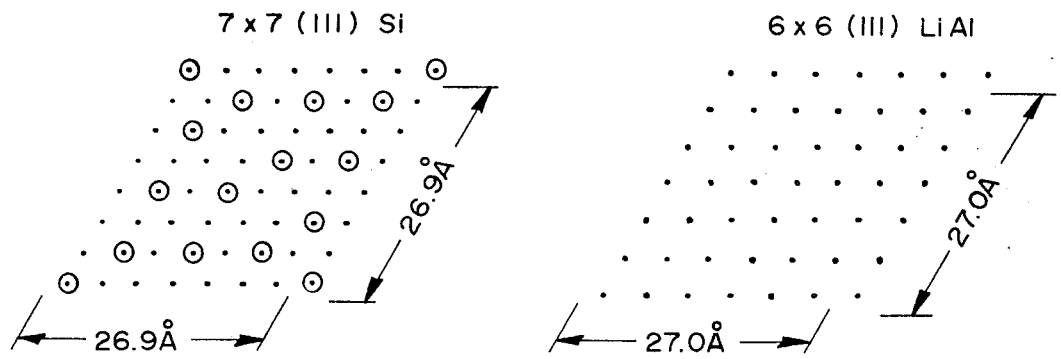
FIG. 1
FIG. 2
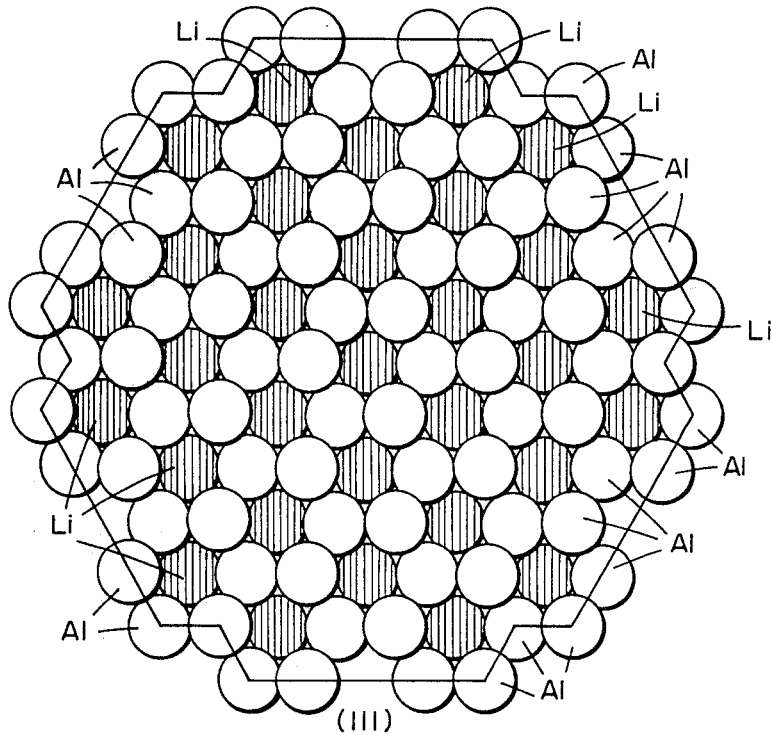
FIG. 3
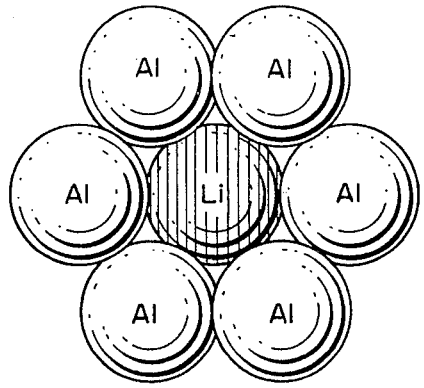
FIG. 3A

LAYER OF CRYSTALLINE SILICON HAVING (111) ORIENTATION ON (111) SURFACE OF LITHIUM ALUMINUM

CROSS-REFERENCE

This application is a continuation-in-part of co-pending application Ser. No. 872,625 filed Jan. 26, 1978.

BACKGROUND OF THE INVENTION

1. Field of the Invention

This invention relates generally to the formation of a layer of crystalline silicon and, more particularly, relates to the formation of a layer of crystalline silicon having a (111) orientation on a (111) surface of lithium aluminum.

2. Prior Art

The formation of crystalline silicon by heteroepitaxial growth on intermetallic compounds in the sodium thallium family is described in U.S. Pat. No. 4,042,447 and in U.S. patent application Ser. No. 789,566, now U.S. Pat. No. 4,115,625. The sodium thallium type intermetallic compounds possess a dual diamond structure in which each element, e.g., lithium, when considered alone forms the diamond crystal structure. In effect two diamond crystal structures are interwoven with three dimensional congruency. Each of the diamond crystal structures is isomorphic with crystalline silicon. As taught in these patents, heteroepitaxial crystal growth is obtained by application of silicon atoms with sufficient energy to allow them to find a periodic bond chain position in a growing film of crystalline silicon. The growing film uses the diamond crystal structure of the heavier element as its pattern or template.

High quality films of crystalline lithium aluminum having a (111) orientation can be prepared as disclosed in co-pending application Ser. No. 872,625. It has now been determined that an optimum heteroepitaxial system within the heteroepitaxial systems described in U.S. Pat. No. 4,042,447 and in application Ser. No. 789,566, now U.S. Pat. No. 4,115,625, is the nucleation, growth and epitaxy of a film of (111) crystalline silicon on such a film of lithium aluminum. This subsystem constitutes the present invention. This specification teaches the reasons for the critical significance of this optimum subsystem. A further purpose of this invention is to provide the particular heteroepitaxial system of silicon on a non-silicon substrate which will lead to the development of cost effective photovoltaics.

BRIEF DESCRIPTION OF THE DRAWINGS

For a more complete understanding of the present invention reference may be had to the figures of the drawings which are incorporated herein by reference and in which:

FIG. 1 is a diagrammatic plan view of the 7×7 reconstructed surface of (111) silicon;

FIG. 2 is a diagrammatic plan view of a 6×6 array of aluminum atoms on the surface of (111) lithium aluminum;

FIG. 3 is a pictorial plan view of the (111) surface of lithium aluminum;

FIG. 3a is an amplified view of three aluminum atoms in the topmost layer, three aluminum atoms in the next lower layer and a single visible lithium atom in the next lower layer of the (111) lithium aluminum of FIG. 3;

SUMMARY OF THE INVENTION

Low strain heteroepitaxy of (111) silicon is obtained on (111) lithium aluminum by the epitaxial relationship completed between the reconstructed 7×7 surface of (111) silicon and 6×6 arrays of aluminum atoms on the surface of the (111) lithium aluminum. The composition forms an integral and durable metallurgical medium. The stable 7×7 reconstructed surface of (111) silicon contains 36 silicon atoms and 13 vacancies for every 49 silicon surface sites. The 36 silicon atoms on an area averaged basis produce a providential match to about 1% with the 36 atoms present in the 6×6 aluminum diamond structure present at the (111) surface of lithium aluminum. The methods for producing the composition include low pressure chemical vapor deposition, magnetically enhanced sputtering and molecular beam epitaxy.

DETAILED DESCRIPTION OF THE PREFERRED EMBODIMENTS

Figure 4:
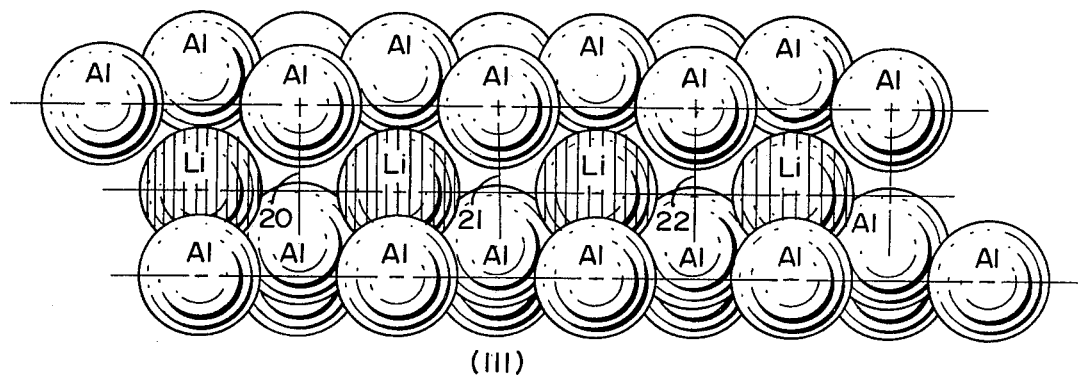
FIG. 4 is a pictorial side view of the (111) surface of the lithium aluminum of FIG. 3.

In any epitaxial system there are numerous choices for substrate orientation. With homoepitaxial systems the choice of a particular orientation may depend upon growth rates, ease of nucleation, growth or epitaxy on a particular crystallographic plane, or upon the required orientation of the homoepitaxial film. With non-isomorphic heteroepitaxial systems the choice may depend upon finding a particular plane which will in fact permit epitaxy. For example, in the silicon-on-sapphire heteroepitaxial system several orientations are possible. See A. Miller, et al., "Single Crystal Silicon Epitaxy on Foreign Substrates", *J. Vac. Sci. and Technology*, V. 3, No. 2, p. 68. With isomorphic heteroepitaxial systems such as silicon on the intermetallic compounds of the sodium thallium family there are two crystallographic parameters which especially affect the heteroepitaxial growth; lattice match and the exposure of the lighter constituent element, either sodium of lithium, at a given surface. Since, in general, the NaTl dual diamond lattices are larger than silicon by approximately 15 to 30% there is no ideal one-on-one epitaxial match; there are a host of systems in which absorbed silicon is stretched apart under tension with varying periodic linear and area relationships to the silicon crystal lattice. However, in each intermetallic compound there is a surface, the (111) plane, which presents only the heavy metal, e.g., Al, to the silicon which is applied. As seen in FIGS. 3 and 4, the dual diamond structure of lithium aluminum can be considered as possessing alternate planes which consist essentially of aluminum, of lithium, of aluminum, etc. When a thin film of lithium aluminum is formed it is the plane which consists essentially of aluminum which is present at the surface since any surface lithium will have evaporated due to its relatively lower temperature of vaporization. The remaining surface, since it uniquely contains or provides a heavy metal skin over the lighter constituent elements, has been found to be stable and therefore desirable for heteroepitaxial overgrowth. Also, the lithium is contained within the aluminum skin so as not to diffuse into and affect the electrical properties of the silicon film. It is precisely this (111) lithium aluminum substrate which can be uniquely produced in high quality crystalline form, e.g., by the method taught in co-pending application Ser. No. 872,625.

In this specification the designation (111) surface is used to refer to the (111) surface of the diamond crystal structure. Thus, the (111) surface of lithium aluminum refers to the (111) surface of a particular one of the dual diamond sublattices as if it were considered alone. See FIGS. 3 and 4. Normally, the diamond sublattice of aluminum is intended since it is the key to nucleation, growth and epitaxy.

The reconstructed 7×7 surface of (111) silicon is a thermodynamically stable surface near room temperature. It is formed from the 2×1 reconstructed surface by annealing within the range of about 350° C. to about 840° C. and remains stable when cooled. The 1×1 surface of (111) silicon exists only above 840° C. See S. R. Morrison, *The Chemical Physics of Surfaces*, pp. 140–142; K. C. Pandey, "Reaction of Atomic Hydrogen with Si(111) Surfaces: Formation of Monohydride and Trihydride Phases" in IBM J. Res. and Development, V. 22, No. 3, May, 1978, p. 250. The 7×7 reconstructed surface is the surface which naturally accommodates the unsaturated bonds of (111) silicon, i.e., the dangling bonds of the (111) silicon surface are allowed to fold back and bond with silicon atoms beneath the outermost layer. The exact nature of the 7×7 reconstructed surface of (111) silicon is not conclusively established. It is believed by some that strict vacancies occur, e.g., 13 out of 49, and by others that the surface is merely distorted with the raising of some atoms, e.g., 36 out of 49, and the lowering of others. See E. Tosatti, "Electronic Superstructures of Semiconductor Surfaces and of Layered Transition-Metal Compounds" in *Festkorperprobleme XV*, 1975, p. 113, 116–122.

For the purpose of this invention the precise mechanism of the 7×7 reconstructed surface is not crucial since it is the area averaged match of the silicon atoms in the 7×7 surface with the aluminum atoms in the 6×6 (111) lithium aluminum array which permits low strain epitaxy. If the distortion model is correct then a perfect template for epitaxy exists. If the strict vacancy model is correct then the strain present in the bonds of the 36 silicon atoms will be averaged over all bonds on an area basis. In the latter case individual bond distortions will be smaller than in the former case and will be more uniform. Since in the former case thermodynamic stability is present there should be even greater stability in the latter case. The important consideration is the area averaged match of the 36 silicon atoms of the 7×7 surface with the 36 atoms of aluminum in the 6×6 configuration on lithium aluminum.

On the (111) surface of Si, as shown in the diagrammatic plan view of a strict site vacancy model in FIG. 1, the 7×7 reconstructed surface would normally consist of 49 atoms spaced 3.84 A° apart (from nucleus to nucleus). The circled sites represent vacancies. The area dimensions of the 7×7 unit area which contains 36 silicon atoms is 0.866×(7×3.84 A°)$^2$ or 625.7 square angstroms. On the (111) surface of LiAl, as shown in FIG. 2, a 6×6 array of Al atoms consists of 36 atoms spaced 4.504 A° apart. The area dimensions of the 36 atoms are 0.866×(6×4.504 A°)$^2$ or 632.4 square angstroms. Thus the 6×6 Al array is about 1% larger in area than the silicon array and the number of atoms is the same. With adsorption on a one-to-one basis of a silicon atom for each aluminum atom, a nearly perfect inverted 7×7 reconstructed surface of (111) silicon is obtained; additional layers of (111) silicon can nucleate and grow on this inverted layer. The one-to-one adsorption is closer to physiosorption than chemisorption because the Al atoms have limited bonding charge available to facilitate an aluminum to silicon bond. The lithium atoms which permit the aluminum to engage in four-fold covalent bonding in the bulk are absent on the (111) lithium aluminum surface. The (111) surface of lithium aluminum has aluminum atoms configured in the diamond structure without having dangling bonds protruding from the surfaces. The mode of adsorption may be over the Li atoms, shown in FIG. 3a, in a kind of weak ionic bonding under certain conditions but is most often going to be directly to the topmost aluminum atoms. The equivalent surface symmetry of (111) lithium aluminum and (111) silicon permits either mode to produce a 7×7 inverted reconstructed surface.

Figure 5:
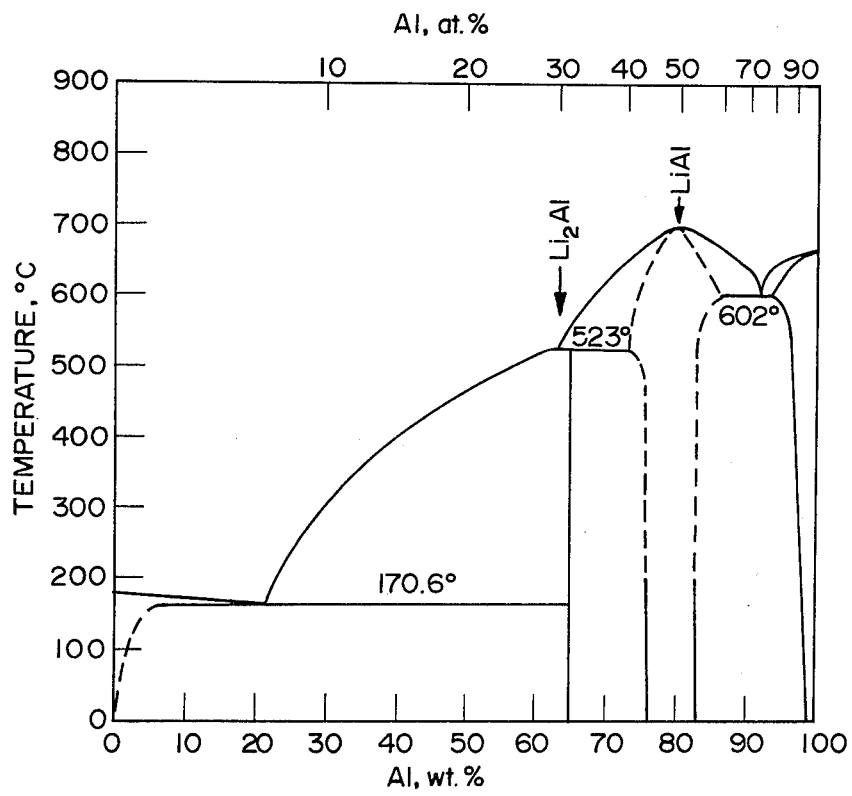
FIG. 5 is a phase diagram of lithium aluminum.

The formation of crystalline silicon having (111) orientation on the (111) aluminum exposed surface of lithium aluminum is accomplished by standard deposition techniques. The (111) lithium aluminum itself is formed, e.g., as taught in co-pending application Ser. No. 872,625. As seen from the phase diagram of FIG. 5 lithium aluminum melts at 718° C. The preferred substrate temperature range over which the silicon deposition is carried out is between about 350° C., the temperature at which the 7×7 reconstructed surface becomes strongly preferred over the 2×1 reconstructed surface, to about 710° C. Sputtering is effective in this range with magnetically assisted sputtering being preferred because it permits higher energies on ionization and lower substrate temperature. Vacuum deposition and its progeny molecular beam epitaxy are effectual as well within this substrate temperature range but may not be as well suited to production scale-up. While chemical vapor deposition of epitaxial silicon is normally not effectual at substrate temperatures in this range, low pressure chemical vapor deposition (LPCVD) does allow deposition, at least at polycrystalline silicon, within this temperature range. See *Chemical Vapor Deposition*, 1977, pp. 169–204. In ultimate production processes a combination of these techniques may be used. For example, sputtering may be used for nucleation and initial growth and low pressure chemical vapor deposition may be used for growth of the remainder of the thin film of 20–50 μm. In this case it is possible that the recovered product may contain the ternary compound LiAlSi at the interface between the silicon and lithium aluminum. And with all deposition techniques traces of this compound may appear at or near the interface. Its zincblende structure is compatible with the epitaxial growth of the (111) silicon. See H. U. Schuster, et al., "Investigations of Neutron Diffraction of the Phases LiAlSi and LiAlGe", *Z. feur Natursforschung*, 31 (B), p. 1540 (1976). This ultimate product is clearly contemplated by the present invention as it consists essentially of silicon having a (111) orientation formed on a layer of lithium aluminum having a (111) orientation.

In the practice of this invention it is contemplated that layers of single crystal silicon of (111) orientation may be produced. In some instances, however, it may be desirable to use faster or less refined processing techniques, e.g., low pressure chemical vapor deposition rather than sputtering, to form polycrystalline silicon rather than single crystal silicon. For certain solar cell applications this lower quality crystalline silicon may prove to be more cost effective than single crystal silicon. On the other hand for power transistor applications good quality single crystal silicon would be desired. Thus, as used in this specification the phraseology crystalline silicon includes both single crystal silicon and polycrystalline silicon.

As known in the semiconductor processing art the most effective epitaxy may be obtained on substrates oriented at angles which are slight deviations from a perfect crystallographic plane. For example, silicon epitaxy on (111) silicon is typically carried out with the silicon substrate several degrees askew from a perfect crystallographic plane. The scope of this invention contemplates such minor deviations so long as the integrity of the aluminum skin of the substrate is perserved.

For hybrid systems designed for electrical power generation and thermal recovery a very thin layer of lithium aluminum, on the order of hundreds of thousands of Angstroms is formed on the surface of clean aluminum sheet. About 20 to 50 μm of (111) silicon is epitaxically grown, the silicon is doped and suitable contacts and antireflective coating are applied. The recovered product has structural integrity and does not require continuous structural support. For lightweight photovoltaic arrays plastic sheet, e.g., Mylar, can be aluminized, lithium aluminum formed and (111) silicon grown and processed; this product is suitable for portable recreational and military applications.

In summary, the formation of a (111) silicon film on the (111) surface of lithium aluminum provides a critically significant heteroepitaxial system of silicon on a non-silicon substrate for the following reasons:

1. The (111) lithium aluminum substrate is a stable surface for the nucleation, growth and epitaxy of crystalline silicon since the aluminum skin covers and contains the lithium.

2. The lattice match on an area basis between silicon atoms in a 7×7 reconstructed silicon (111) surface and a 6×6 array of aluminum atoms is within about 1 percent. The 7×7 array of silicon atoms continues and completes the 6×6 array of aluminum atoms. The 6×6 arrays of aluminum atoms are a providental template for the 7×7 reconstructed (111) silicon surface.

3. (111) lithium aluminum is peculiarly susceptible to formation in a high quality crystalline film as taught in co-pending application Ser. No. 872,625.

4. Aluminum and silicon are abundent elements in the earth's crust, even beyond statistical expectation, and are therefore preeminently suited to providing the basis for a cost effective photovoltaic system. This system will consist of silicon on a very thin surface layer of lithium aluminum formed in aluminum sheet.

5. Lithium aluminum has excellent electrical power transfer characteristics as demonstrated by its utilization as electrodes in electrochemical cells and can therefore function as power transistor contacts in the semiconductor field and as stable backside electrical contacts in the photovoltaic field.

6. A backing principally composed of aluminum is optimum for a thin film silicon solar cell as its high reflectance will permit multiple passes of non-absorbed photons through the film.

7. Back surface fields are effectual in enhancing efficiency in thin film silicon cells and are often produced by heavy aluminum doping adjacent the backside contact. This is entirely compatible with a silicon on lithium aluminum cell.

8. A thin film silicon cell on a lithium aluminum surface formed in aluminum sheet permits simultaneous collection of electrical and thermal energy thereby enhancing the economic viability of the system.

9. Lithium aluminum is exceptionally stable within the lithium-aluminum phase diagram and the melting point of lithium aluminum is high enough to render it suitable over a large portion of the temperature range at which the 7×7 reconstructed surface of (111) silicon can be formed.

10. Neither lithium nor aluminum individually forms compounds with silicon. The ternary compound silicon-lithium-aluminum has the zincblende structure which is entirely compatible with the heteroepitaxy of this invention.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A method for producing a layer of crystalline silicon having a (111) orientation comprising:
providing a substrate of crystalline lithium aluminum, said substrate having essentially a (111) orientation and having an exposed aluminum surface;
gradually applying silicon atoms thereto from the vapor state at a rate which allows said silicon atoms to arrange themselves for oriented overgrowth on said substrate; and
recovering a product comprising a layer of crystalline silicon having a (111) orientation upon a (111) lithium aluminum substrate, said layer of crystalline silicon having a reconstructed 7×7 surface configuration at the silicon-aluminum interface which has epitaxial relationship with a 6×6 aluminum surface structure on the (111) lithium aluminum.

2. A method as in claim 1 further comprising providing thermal energy to said lithium aluminum substrate to maintain it at a temperature in the range of about 350° C. to about 710° C.

3. A method as in claim 1 wherein said step of applying atoms of silicon is accomplished by sputtering.

4. A method as in claim 3 wherein said step of applying atoms of silicon by sputtering is accomplished by magnetically enhanced sputtering.

5. A method as in claim 4 wherein after said step of applying atoms of silicon by magnetically enhanced sputtering additional silicon is followed by the further step of low pressure chemical vapor deposition.

6. A method as in claim 1 wherein said step of applying silicon atoms is accomplished by vacuum deposition.

7. A method as in claim 6 wherein said step of applying silicon atoms by vacuum deposition is accomplished by molecular beam epitaxy.

8. A method as in claim 1 wherein said step of applying atoms of silicon is accomplished by chemical vapor deposition.

9. A method as in claim 8 wherein said step of applying atoms of silicon by chemical vapor deposition is accomplished by low pressure chemical vapor deposition.

* * * * *

UNITED STATES PATENT AND TRADEMARK OFFICE
CERTIFICATE OF CORRECTION

PATENT NO. : 4,235,662

DATED : November 25, 1980

INVENTOR(S) : NORMAN E. REITZ

It is certified that error appears in the above—identified patent and that said Letters Patent is hereby corrected as shown below:

Column 1, line 24, after "diamond" and before "structure" insert --crystal--.

Column 5, line 12, "perserved" should be --preserved--.

Signed and Sealed this

Nineteenth Day of October 1982

[SEAL]

Attest:

Attesting Officer

GERALD J. MOSSINGHOFF

Commissioner of Patents and Trademarks